(12) United States Patent
Spiegel et al.

(10) Patent No.: US 9,143,093 B2
(45) Date of Patent: Sep. 22, 2015

(54) IMPEDANCE MATCHING SYSTEM THAT HAS A TRANSFORMER AND METHOD FOR TUNING A SYSTEM USING A TRANSFORMER

(71) Applicants: Solon Jose Spiegel, Tel Aviv (IL); Lior Blanka, Rosh Haayin (IL)

(72) Inventors: Solon Jose Spiegel, Tel Aviv (IL); Lior Blanka, Rosh Haayin (IL)

(73) Assignee: DSP GROUP LTD., Herzeliya (IL)

( * ) Notice: Subject to any disclaimer, the term of this patent is extended or adjusted under 35 U.S.C. 154(b) by 79 days.

(21) Appl. No.: 14/061,773

(22) Filed: Oct. 24, 2013

(65) Prior Publication Data

US 2015/0116033 A1 Apr. 30, 2015

(51) Int. Cl.
*H04B 1/04* (2006.01)
*H03F 1/56* (2006.01)
*H03F 3/21* (2006.01)
*H03F 3/24* (2006.01)

(52) U.S. Cl.
CPC ............... *H03F 1/565* (2013.01); *H03F 3/211* (2013.01); *H03F 3/245* (2013.01); *H03F 2200/387* (2013.01); *H03F 2200/391* (2013.01); *H03F 2200/541* (2013.01)

(58) Field of Classification Search
CPC ......... H03H 7/38; H04B 1/0458; H04B 1/525
USPC ............. 455/73, 77, 78, 83, 87, 91, 107, 120, 455/121, 150.1, 178.1, 191.1, 193.1, 193.2, 455/193.3, 248.1
See application file for complete search history.

(56) References Cited

U.S. PATENT DOCUMENTS

| 2007/0207746 | A1* | 9/2007 | Huang et al. | 455/78 |
| 2012/0009889 | A1* | 1/2012 | Morgan et al. | 455/188.1 |
| 2012/0062322 | A1* | 3/2012 | Owen | 330/296 |

* cited by examiner

*Primary Examiner* — Tuan Pham
(74) *Attorney, Agent, or Firm* — Reches Patents

(57) ABSTRACT

A system that includes an amplification circuit; a resonant circuit that is arranged to receive the amplified signal and to output an resonant circuit output signal; wherein the resonant circuit comprises a continually tuned variable capacitor; a transformer that is arranged to receive the resonant circuit output signal and to output a transformer output signal; a coupler that is arranged to sample the transformer output signal and a reflected signal and to output a first signal that represents the transformer output signal and a second signal that represents a reflected signal; a detector that is arranged to receive the first and second signals and to output an impedance indicative signal a control circuit that is arranged to generate the resonant circuit tuning signal in response to the impedance indicative signal and for compensating for the impedance mismatch.

20 Claims, 9 Drawing Sheets

120

Freq. 6.000GHz to 6.000GHz

IMPEDANCE MATCHING SYSTEM THAT HAS A TRANSFORMER AND METHOD FOR TUNING A SYSTEM USING A TRANSFORMER

FIELD OF THE INVENTION

The present invention relates to antenna impedance matching of radio frequency (RF) transmission systems.

BACKGROUND OF THE INVENTION

Systems that transmit RF signals usually include an amplifier, followed by some passive structures as filters and switches that are connected via a matching circuit to an RF antenna. The impedances of the RF antenna and the amplifier should be matched to fifty Ohms in order to optimize the transmission of RF signals via the RF antenna and minimize the voltage standing wave ratio (VSWR) at the RF antenna.

Variable Matching circuit s might include variable capacitors (varactors) such as Gallium Arsenide (GaAs) varactors that provide change in their capacitance value according to an applied an input bias voltage. The GaAs varactor have a relatively limited capacitance range (the ratio between the maximal capacitance and the minimal capacitance of the GaAs varactor is usually less than four) and thus can perform an impedance match over a relatively limited impedance and frequency ranges.

Furthermore, because the GaAs varactor operates in the reversed-bias region, it should not receive an input voltage that will drive the GaAs varactor into the forward-bias region. As a result, the GaAs varactor should manage only an input voltage having a constant (DC) and variable components (AC) where the AC component has relatively limited voltage swing.

The GaAs varactor exhibits a non-linear relationship between its capacitance and the input bias voltage. It is desired to operate the GaAs varactor in a linear (or almost linear) region of operation to minimize non-linear distortions. FIG. 1 includes a graph 10 that represents the varactor non-linear relationship between the capacitance and the input bias voltage. Cmin 11 Cmax 12 are the minimal and maximal capacitances of the GaAs varactor. Vmin and Vmax 13 and 14 are minimal and maximal values of the input voltage and are designed to maintain the GaAs varactor in a reserved bias region. Curve 15 illustrates a maximal tolerable voltage swing of the input signal. The minimum peak voltage of the AC component VPMIN 16 should not exceed the junction potential required to bring the GaAs varactor into the forward region and the maximum peak voltage VPMAX 17 should be less than maximum allowed reverse voltage defined by the break-down voltage of the device.

In FIG. 1, the maximum allowed change in the operation point VBIAS 18 depends inversely on the peak-to-peak voltage swing across the varactor structure as the operation range of the varactor is limited by the maximum allowed forward and reverse bias conditions. Thus to provide a wide variable capacitance range, enabling the implementation of variable matching circuit s large impedance and frequency ranges, the AC component across the GaAs varactor should be minimized.

There is a growing need to provide system and method for impedance matching of RF systems over a relatively large impedance and frequency ranges and while managing signals of high voltage swing.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
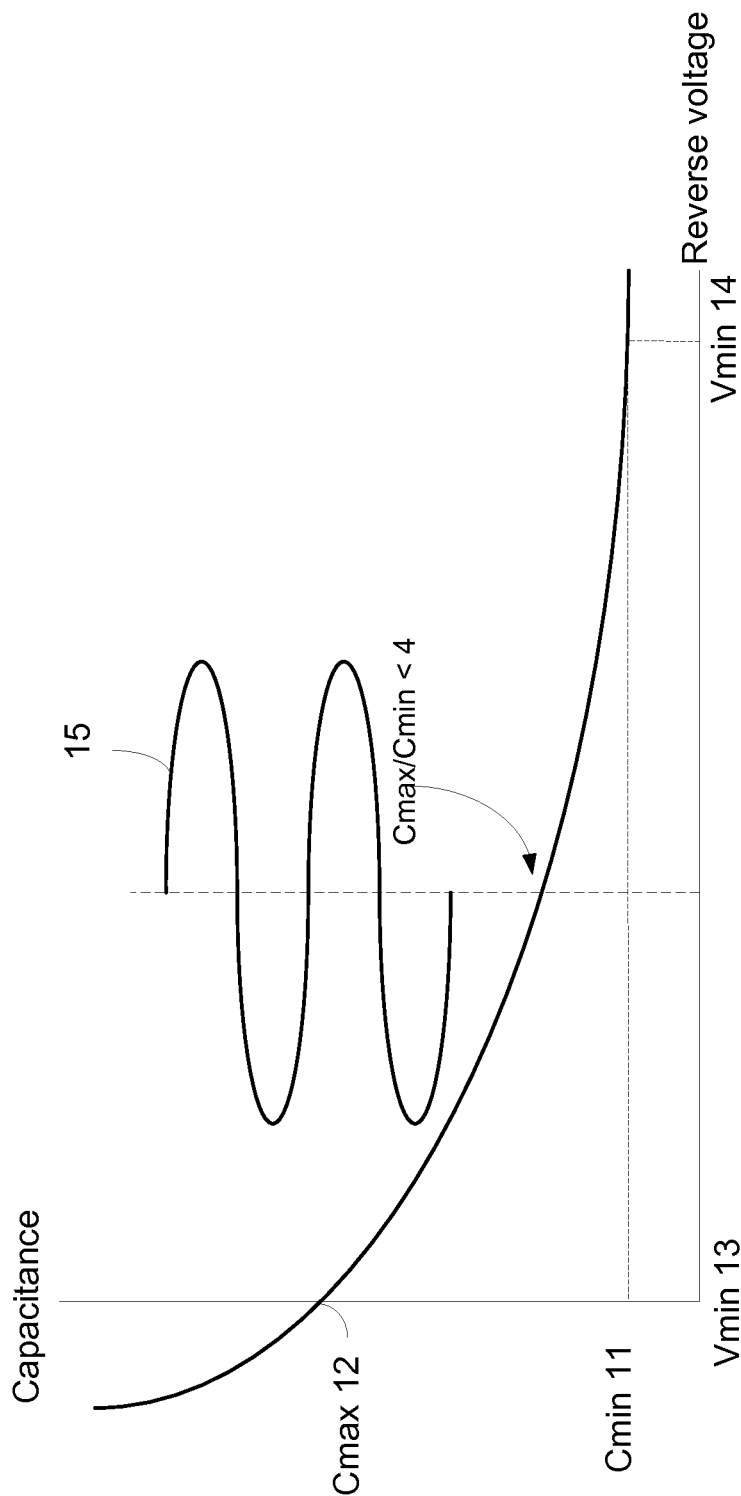
FIG. 1 includes a graph that represents a typical the non-linear relationship between a capacitance and an input voltage of a GaAs varactor.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

SUMMARY

According to an embodiment of the invention there is provided a system that may include: (a) an amplification circuit that is arranged to amplify an transmit signal for providing an amplified transmit signal; (b) a variable resonant circuit (also known as a variable LC circuit) that is arranged to receive the amplified transmit signal and to output a variable resonant circuit output signal; wherein the resonant circuit comprises a variable capacitor that is a continually tuned variable capacitor; (c) a transformer that is arranged to receive the variable resonant circuit output signal and to output a transformer output signal; (d) a coupler that is arranged to sample the transformer output incident and reflected signals at and to output a first signal that represents the transformer output incident signal and a second signal that represents the transformer output reflected signal; (e) a detector that is arranged to receive the transformer output incident and reflected signals and to output an impedance indicative signal that is indicative of an impedance mismatch between an output impedance of the variable resonant circuit as seen after the transformer and an impedance the antenna; wherein the antenna is coupled to an output port of the coupler; wherein the variable resonant circuit is arranged to receive a variable resonant circuit tuning signal and to set an impedance of the variable resonant circuit in response to the variable resonant circuit tuning signal; and (f) a control circuit that is arranged to generate the variable LC tuning signal in response to the impedance indicative signal and for compensating for the impedance mismatch.

The transformer has a turns ratio of 1:N, N being a positive number. Accordingly—the 1:N transformer boosts the voltage it receives (variable resonant circuit output signal) by a factor of N—the voltage at the output of the transformer is N times the voltage at the input of the transformer. This amplification allows the varactor of the variable resonant circuit to experience a voltage difference across its terminals that is N times smaller than the transformer output voltage. For N=1, the voltage swing across the varactor represents the maximum voltage swing Furthermore—the 1:N transformer introduces a square law with N between output and input impedances and the varactor can be required to exhibit an impedance that is a fraction (1/N*N) of the impedance of the RF antenna. Since the ratio of the input and output transformer varies with the square law of N, small changes in the transformer input impedance obtained by the capacitance change in the varactor cause large impedance variation at the output of the transformer. As a result, the system comprised of a variable resonant circuit and transformer enables to perform a wide impedance matching over relatively large ranges of antenna impedance and frequencies.

According to an alternative embodiment of the invention, the transformer represents any impedance transformation implemented with passive structures.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuit s known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

The terms "RF antenna" and "antenna" are used in interchangeable manner.

Any reference to a "resonant circuit" should be interpreted as referring to a variable resonant circuit that its parameters (inductance, capacitance, frequency) can be adjusted.

Figure 2:
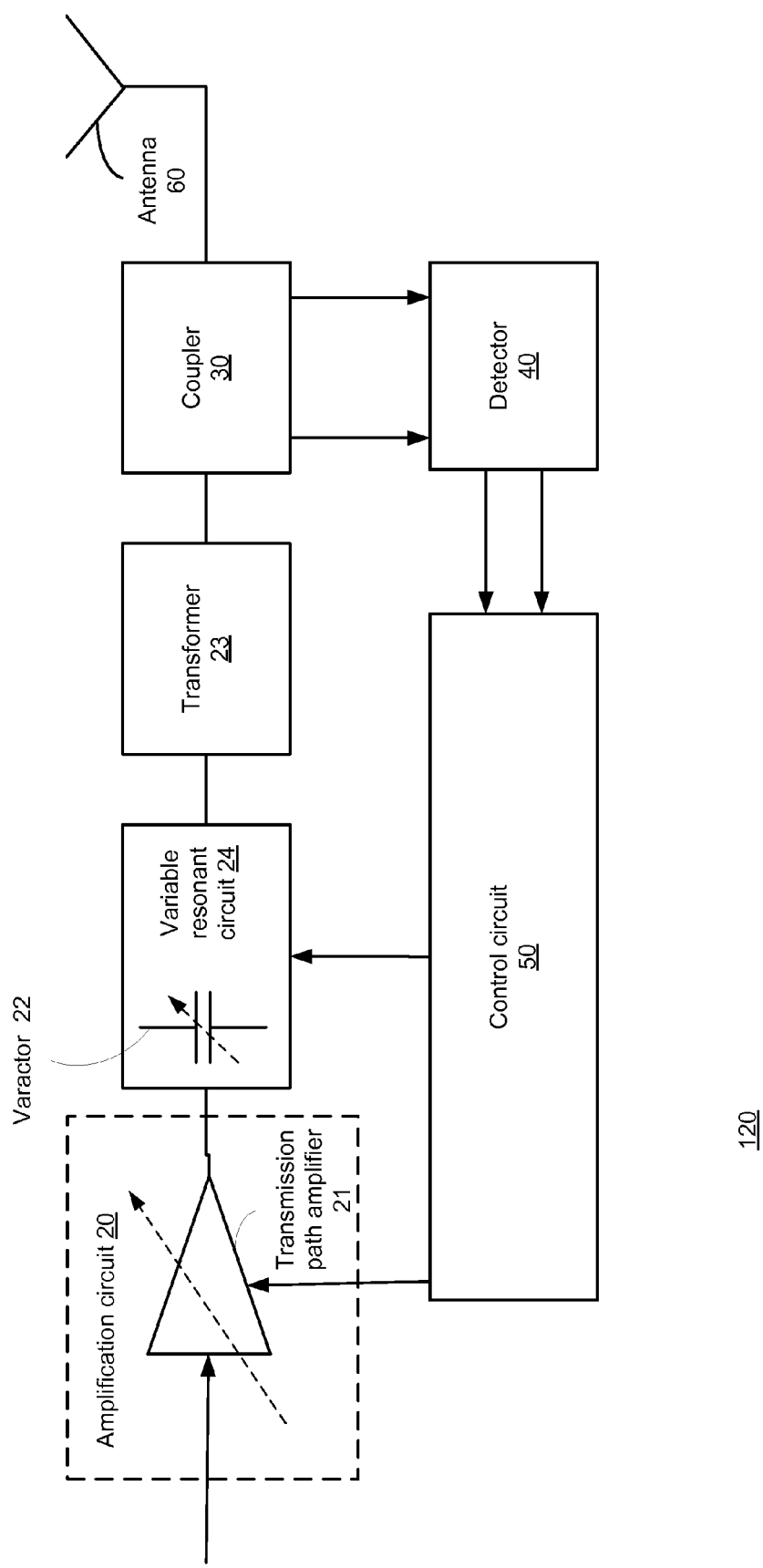
FIG. 2 is a schematic illustration of a system according to an embodiment of the invention.
Figure 3:
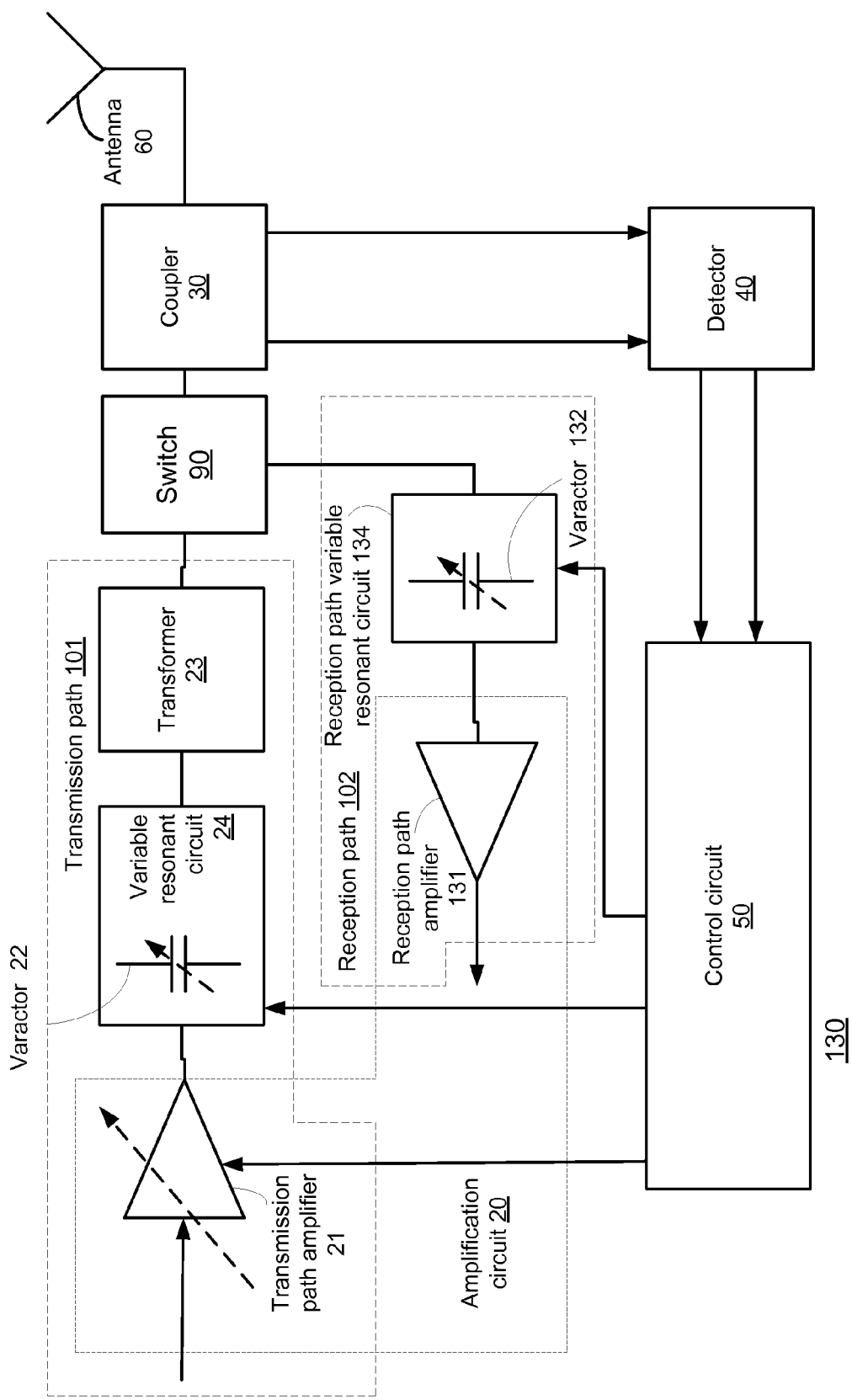
FIG. 3 is a schematic illustration of a system according to an embodiment of the invention.
Figure 4:
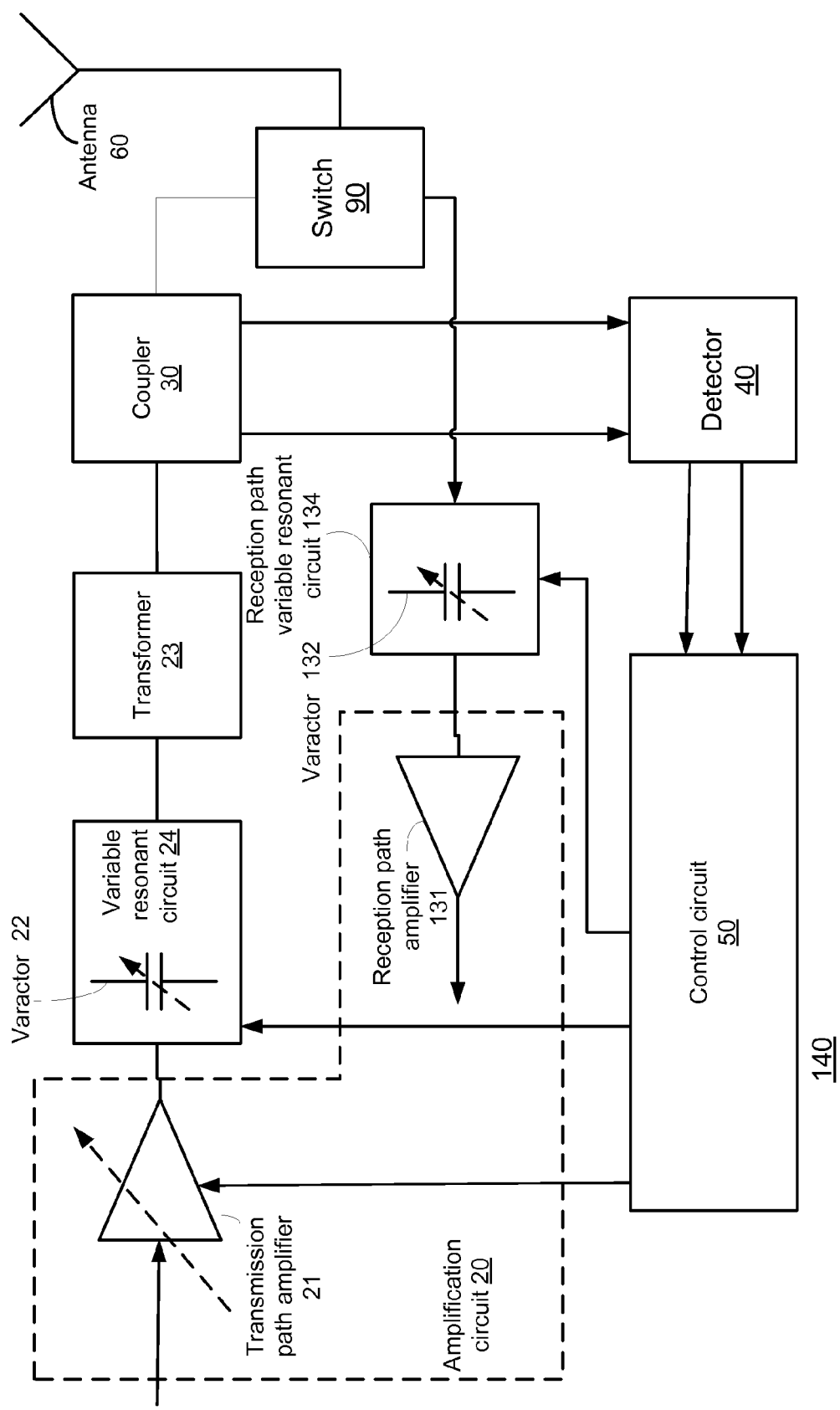
FIG. 4 is a schematic illustration of a system according to an embodiment of the invention.

FIGS. 2-4 illustrate systems 120, 130 and 140 according to various embodiments of the invention. FIG. 5 illustrates a portion 70 of a system 120 according to an embodiment of the invention.

FIG. 2 illustrates only a transmission path and FIGS. 3 and 4 illustrate both a reception path and a transmission path. The difference between FIGS. 3 and 4 is the location of the coupler 30—before a switch 90 (FIG. 4) of after the switch 90 (FIG. 3).

Referring to FIG. 2—system 120 includes:

a. An amplification circuit 20 that include transmission path amplifier 21 that is arranged to amplify a transmit signal for providing an amplified transmit signal.

b. A variable resonant circuit 24 that is arranged to receive the amplified transmit signal and to output a variable resonant circuit output signal. The variable resonant circuit 24 is arranged to receive a variable resonant circuit tuning signal and to set an impedance of the variable resonant circuit in response to the variable resonant circuit tuning signal. The resonant circuit includes a variable capacitor 22 that is a continually tuned variable capacitor.

c. A transformer 23 that is arranged to receive the variable resonant circuit output signal and to output a transformer output signal thereby forming transformer output incident and reflected signals.

d. A coupler 30 that is arranged to sample the transformer output incident and reflected signals at and to output a first signal that represents the transformer output incident signal and a second signal (Vi, Vr) that represents the transformer output reflected signal.

e. A detector (merged LOG/PH detector) 40 that is arranged to receive the transformer output incident and reflected signals and to output an impedance indicative signal that is indicative of an impedance mismatch between an (a) output impedance of the variable resonant circuit as seen after the transformer 23 and (b) an impedance the antenna 60.

f. Antenna 60 that is coupled to an output port of the coupler 30. The variable resonant circuit 24 is arranged to receive a variable resonant circuit tuning signal and to set an impedance of the variable resonant circuit in response to the variable resonant circuit tuning signal.

g. A control circuit 50 that is arranged to generate the variable LC tuning signal in response to the impedance indicative signal and for compensating for the impedance mismatch.

Referring to FIG. 3—system 130 includes:

h. An amplification circuit 20 that includes (a) a transmission path amplifier 21 that is arranged to amplify a transmit signal for providing an amplified transmit signal; and (b) a reception path amplifier 131.

i. Variable resonant circuit 24 that is arranged to receive the amplified transmit signal and to output a variable resonant circuit output signal. The variable resonant circuit 24 is arranged to receive a variable resonant circuit tuning signal and to set an impedance of the variable resonant circuit in response to the variable resonant circuit tuning signal.

j. A reception path variable resonant circuit 132 that is arranged to receive the amplified transmit signal and to output a reception path variable resonant circuit output signal. The reception path variable resonant circuit 132 is arranged to receive a reception path variable resonant circuit tuning signal and to set an impedance of the reception path variable resonant circuit in response to the reception path variable resonant circuit tuning signal. The reception path variable resonant circuit 132 may include a variable capacitor 134.

The reception path variable resonant circuit 132 may be adjusted during the transmission interval. During the receiving interval, the applied tuning voltage (vrlc) may remain unchanged, thus compensating for the antenna impedance variations in the receiving mode as well.

k. A transformer 23 that is arranged to receive the variable resonant circuit output signal and to output a transformer output signal thereby forming transformer output incident and reflected signals.

l. A switch 90 that is arranged to allow the transmission path 101 and the reception path 102 to share the antenna 60 by applying a time division multiplexing scheme. In FIG. 3 a coupler 30, an output of the transformer 23 and an input of a reception path variable resonant circuit 132 are coupled to the switch 90. Transmittion path 101 includes transmittion path amplifier 21 and transmission path variable resonant circuit 24. Reception path 102 includes reception path amplifier 131 and reception path variable resonant circuit 134.

m. A coupler 30 that is arranged to sample (when the switch 90 couples the transformer 23 to the coupler 30) the transformer output incident and reflected signals at and to output a first signal that represents the transformer output incident signal and a second signal (Vi, Vr) that represents the transformer output reflected signal.

n. A detector (merged LOG/PH detector) 40 that is arranged to receive the transformer output incident and reflected signals and to output an impedance indicative signal that is indicative of an impedance mismatch between an (a) output impedance of the variable resonant circuit as seen after the transformer 23 and (b) an impedance the antenna 60.

o. Antenna 60 that is coupled to an output port of the coupler 30.

p. A control circuit 50 that is arranged to generate the variable LC tuning signal in response to the impedance indicative signal and for compensating for the impedance mismatch. The control circuit is also arranged to generate the reception path variable LC tuning signal. Both signals (variable LC tuning signal and reception path variable LC tuning signal) can be the same but may differ from each other. In FIG. 3 both signals are illustrated as being the same—they are provided over the same control line.

Referring to FIG. 4—system 140 includes:

q. An amplification circuit 20 that includes (a) a transmission path amplifier 21 that is arranged to amplify a transmit signal for providing an amplified transmit signal; and (b) a reception path amplifier 131.

r. A variable resonant circuit 24 that is arranged to receive the amplified transmit signal and to output a variable resonant circuit output signal. The variable resonant circuit 24 is arranged to receive a variable resonant circuit tuning signal and to set an impedance of the variable resonant circuit in response to the variable resonant circuit tuning signal.

s. A reception path variable resonant circuit 132 that is arranged to receive the amplified transmit signal and to output a variable resonant circuit output signal. The reception path variable resonant circuit 132 is arranged to receive a reception path variable resonant circuit tuning signal and to set an impedance of the reception path variable resonant circuit in response to the reception path variable resonant circuit tuning signal. The reception path variable resonant circuit 132 may be adjusted during the transmission interval. During the receiving interval, the applied tuning voltage (vrlc) may remain unchanged, thus compensating for the antenna impedance variations in the receiving mode as well.

t. A transformer 23 that is arranged to receive the variable resonant circuit output signal and to output a transformer output signal thereby forming transformer output incident and reflected signals.

u. A switch 90 that is arranged to allow the transmission and reception paths to share the antenna 60 by applying a time division multiplexing scheme. In FIG. 4 a coupler 30, an input of the antenna 60 and an input of a reception path variable resonant circuit 132 are coupled to the switch 90.

v. A coupler 30 that is arranged to sample the transformer output incident and reflected signals at and to output a first signal that represents the transformer output incident signal and a second signal (Vi, Vr) that represents the transformer output reflected signal.

w. A detector (merged LOG/PH detector) 40 that is arranged to receive the transformer output incident and reflected signals and to output an impedance indicative signal that is indicative of an impedance mismatch between an (a) output impedance of the variable resonant circuit as seen after the transformer 23 and (b) an impedance the antenna 60.

x. Antenna 60 that is coupled to an output port of the switch 90.

y. A control circuit 50 that is arranged to generate the variable LC tuning signal in response to the impedance indicative signal and for compensating for the impedance mismatch. The control circuit is also arranged to generate the reception path variable LC tuning signal. Both signals (variable LC tuning signal and reception path variable LC tuning signal) can be the same but may differ from each other. In FIG. 4 both signals are illustrated as being the same—they are provided over the same control line.

Figure 5A:
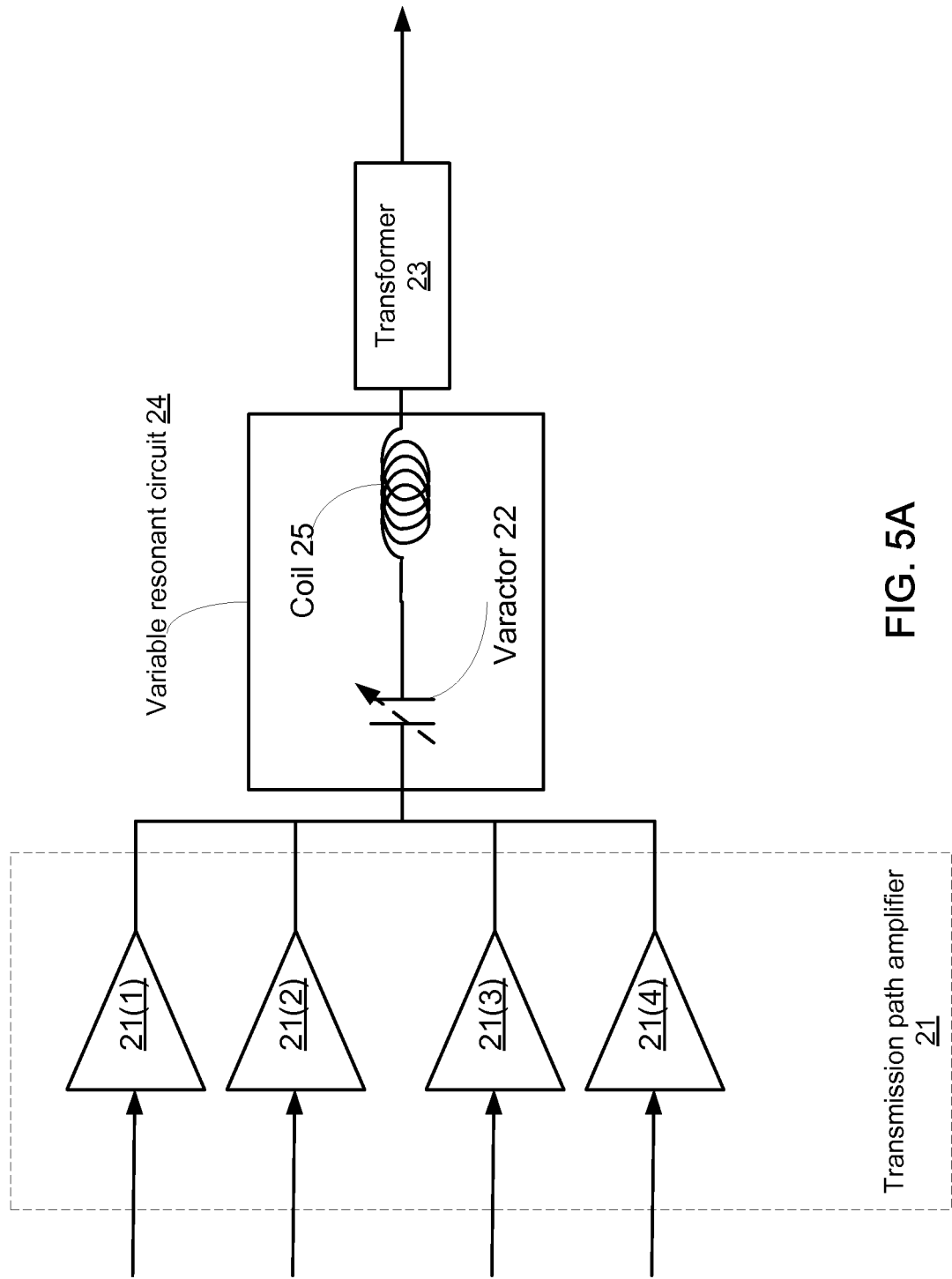
FIGS. 5A and 5B illustrates a portion of a system according to an embodiment of the invention.

In FIG. 5A multiple power amplifier cells 21(1)-21(4) of transmititon path amplifier, each having an output impedance determined according to the maximum output power and to the quiescent operation points of the devices. Depending on the output power delivered by each of the power amplifier cells 21(1)-21(4), multiple power cells are combined to increase the total output power. The output impedance of the power amplifier decreases with the number of power amplifier cells combined. For example, four power amplifier cells 21(1)-21(4) combined with fifty ohms output impedance each result in twelve and a halve ohms output impedance. These power amplifier cells are connected to variable resonant circuit 24 that includes variable capacitor 22 and coil 25. By lowering the reference impedance of the system, in other words, tuning the matching circuit at lower impedance level and boosting the impedance transformation with the transformer, increases the range of the variable impedance matching circuit of the system.

Figure 5B:
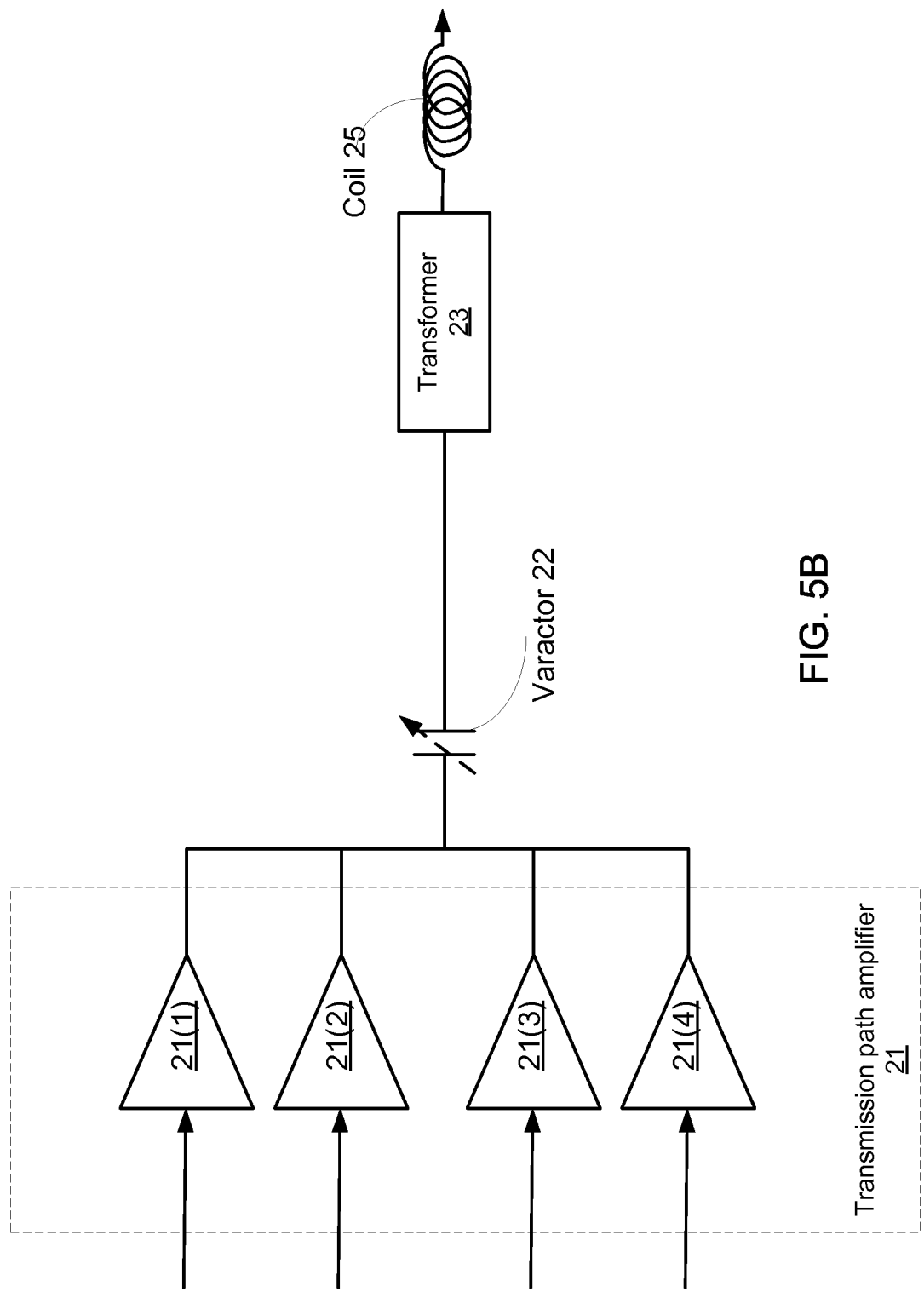

In FIG. 5B, the coil 25 is located after the transformer. The main different between FIGS. 5A and 5B is the value of the inductance of coil. As the coil in FIG. 5B is located at higher impedance level, its value is larger than the inductance value of FIG. 5A due to the impedance transformation.

Figure 8:
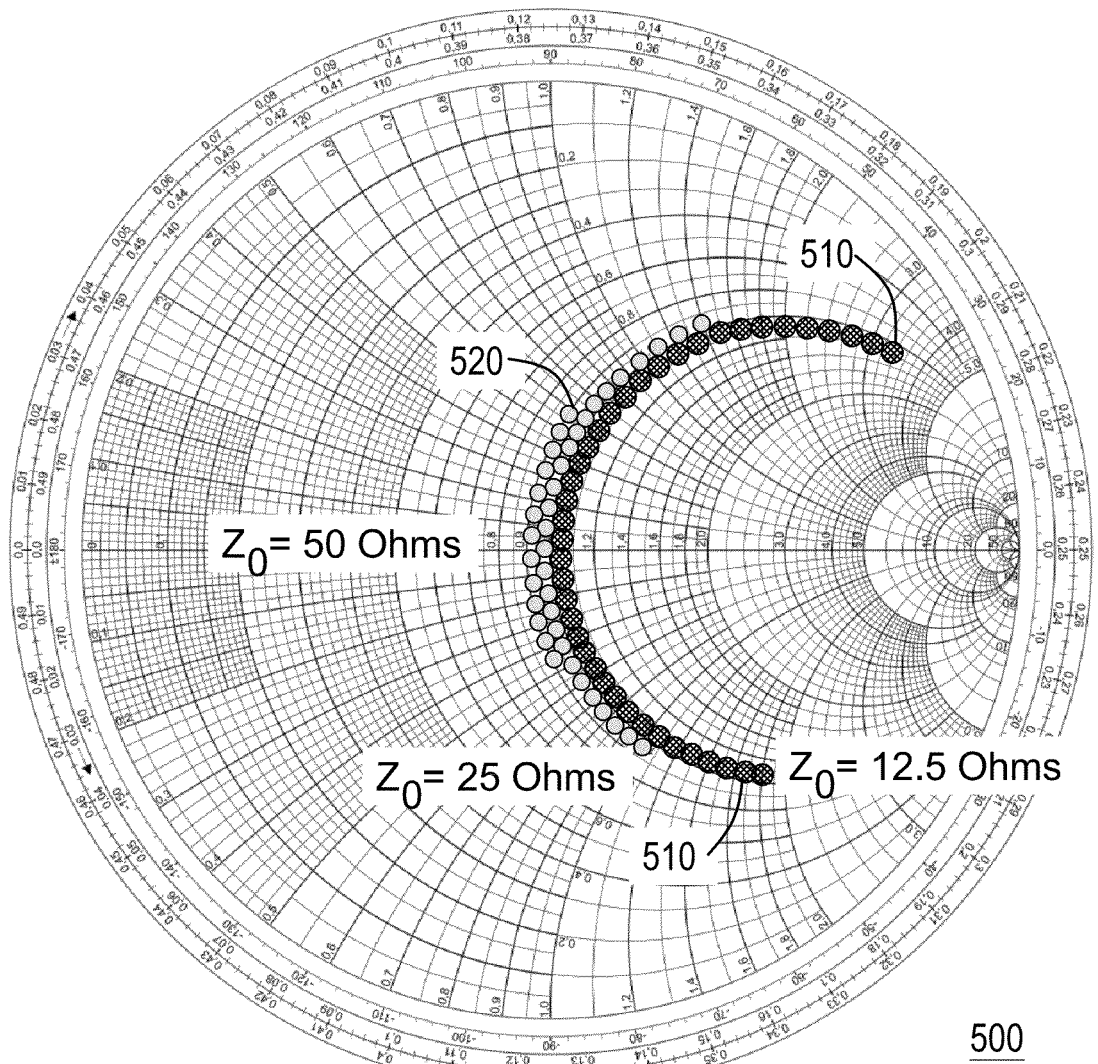
FIG. 8 illustrates a chart according to an embodiment of the invention.

FIG. 8 illustrates a chart 500 showing that with a set of power amplifiers cells that provides a total output impedance of about twelve and a half Ohms, the system compensates for large antenna impedance variations. The curve 510 in chart 500 illustrates that impedance variations between 50−j100 Ohms and 50+j150 Ohms are compensated. The antenna impedance compensation was obtained with a GaAs varactor with limited ratio between the maximum and minimum capacitance values. In contrast, using sets that had impedance of twenty five and fifty Ohms displays small variations in the antenna impedance as observed in curves 520 and 530 respectively. The results obtained in curves 520 and 530 indicate that GaAs varactor does not provide sufficient capacitance ratio for applications that required tuning the matching circuit over a wide frequency and impedance ranges.

Figure 6:
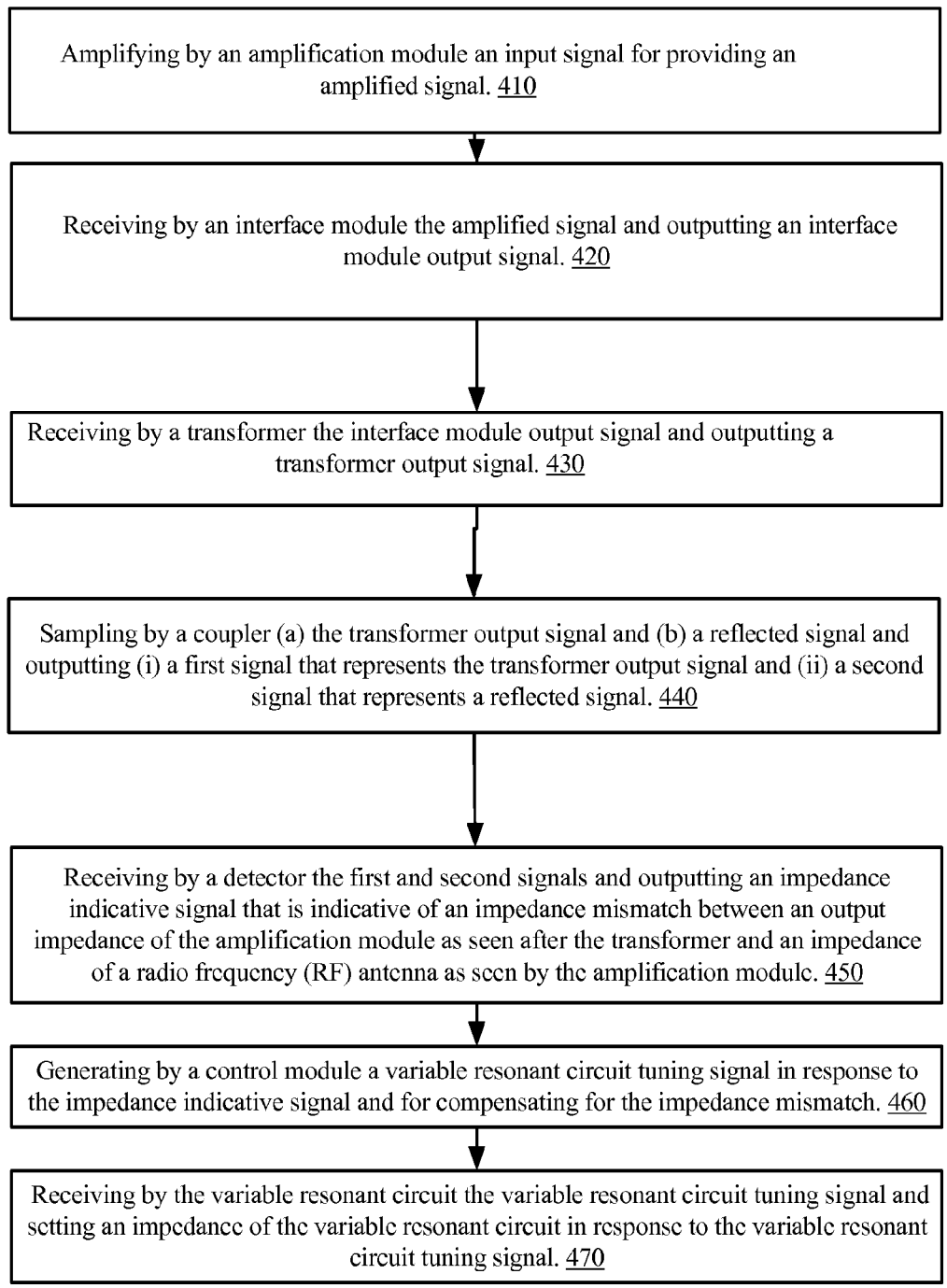
FIGS. 6 and 7 illustrate a flowchart of the method according to an embodiment of the invention.

FIG. 6 illustrates method 400 according to an embodiment of the invention.

Method 400 may start by stage 410 of amplifying, by an amplification circuit, a transmit input signal for providing an amplified transmit signal.

Stage 410 may be followed by stage 420 of receiving, by a variable resonant circuit, the amplified transmit signal and outputting a variable resonant circuit output signal.

Stage 420 may be followed by stage 430 of receiving, by a transformer, the variable resonant circuit output signal and outputting a transformer output signal thereby forming transformer output incident and reflected signals.

Stage 430 may be followed by stage 440 of sampling by a coupler (a) the transformer output incident and reflected signals and outputting (i) a first signal that represents the transformer output incident signal and (ii) a second signal that represents the transformer output reflected signal.

Stage 440 may be followed by stage 450 of receiving by a detector the first and second signals and outputting an impedance indicative signal that is indicative of an impedance mismatch between (a) an output impedance of the variable resonant circuit as seen after the transformer and (b) an impedance of a radio frequency (RF) antenna as seen by the amplification circuit. The RF antenna is connected, directly or indirectly to an output port of the coupler.

Stage 450 may be followed by stage 460 of generating by a control circuit a variable resonant circuit tuning signal in response to the impedance indicative signal and for compensating for the impedance mismatch.

Stage 460 may be followed by stage 470 of receiving, by the variable resonant circuit, the variable resonant circuit tuning signal and setting an impedance of the variable resonant circuit in response to the variable resonant circuit tuning signal.

The impedance ratio between (a) an output impedance of the variable resonant circuit at an output port of the amplification circuit and (b) an input impedance of the RF antenna at an input port of the RF antenna may exceed two.

The impedance ratio between (a) an output impedance of the variable resonant circuit at an output port of the amplification circuit and (b) an input impedance of the RF antenna at an input port of the RF antenna may be smaller than one half.

The input impedance of the RF antenna at the input port of the RF antenna may substantially equal fifty Ohms. The output impedance of the amplification circuit at the output port of the amplification circuit may equal 50/(N*N) Ohms and wherein the transformer has a turns ratio of 1:N, N being a positive number. N may be equal to 2, 3, 4, 5, 6, 7, 8, 9, 10 and even more.

Figure 7:
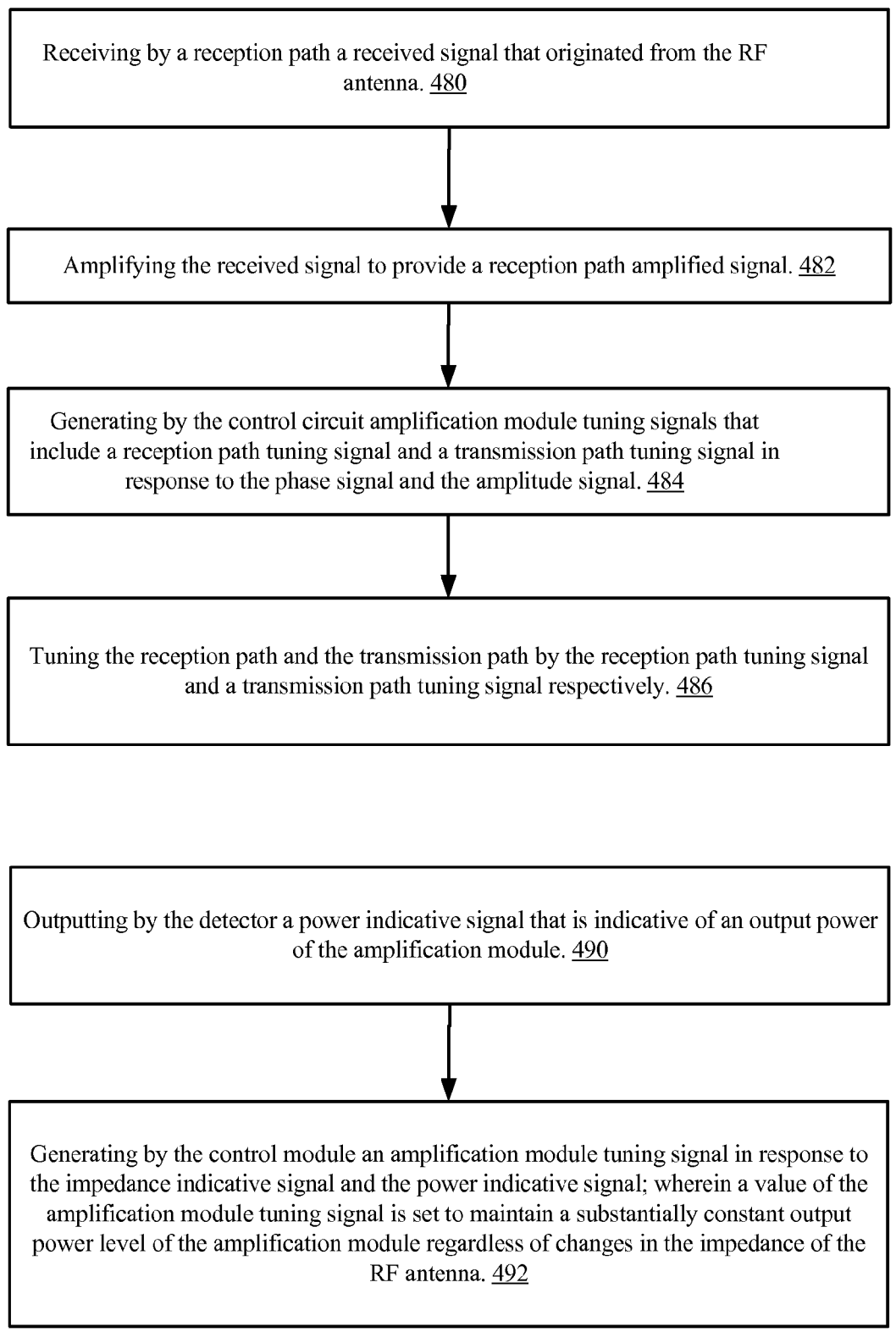

Method 400 may also include at least one of stages 480, 482, 484, 486, 490 and 492. These stages are shown in FIG. 7.

Stage 480 includes receiving by a reception path a received signal that originated from the RF antenna.

Stage 482 includes amplifying the received signal to provide a reception path amplified signal.

Stage 484 includes generating by the control circuit amplification circuit tuning signals that include a reception path tuning signal and a transmission path tuning signal in response to the phase signal and the amplitude signal.

Stage 486 includes tuning the reception path and the transmission path by the reception path tuning signal and a transmission path tuning signal respectively.

During at least one point of time the reception path tuning signal may equal the transmission path tuning signal.

During at least one point of time the reception path tuning signal may differ from the transmission path tuning signal.

The tunable amplification circuit may include a power amplifier that is followed by a first variable capacitor. Stage 470 may include setting a capacitance of the first variable capacitor by the transmission path tuning signal.

The reception path tunable amplification unit may include a reception path amplifier that is preceded by a second variable amplifier. Stage 486 may include setting a capacitance of the second variable capacitor by the reception path tuning signal.

Stage 490 may include outputting by the detector a power indicative signal that is indicative of an output power of the amplification circuit.

Stage 492 may include generating by the control circuit an amplification circuit tuning signal in response to the impedance indicative signal and the power indicative signal; wherein a value of the amplification circuit tuning signal is set to maintain a substantially constant output power level of the amplification circuit regardless of changes in the impedance of the RF antenna.

Method 400 may include switching between a reception mode and a transmission mode—this may be implemented by using a transmission reception switch such as 90.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, Flash memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuit s or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system comprising:
   an amplification circuit that is arranged to amplify an input signal for providing an amplified signal;
   a variable resonant circuit that is arranged to receive the amplified signal and to output a variable resonant circuit output signal; wherein the variable resonant circuit comprises a variable capacitor that is a continually tuned variable capacitor;
   a transformer that is arranged to receive the variable resonant circuit output signal and to output a transformer output signal;
   a coupler that is arranged to sample the transformer output signal and a reflected signal and to output a first signal that represents the transformer output signal and a second signal that represents the reflected signal;
   a detector that is arranged to receive the first and second signals and to output an impedance indicative signal that is indicative of an impedance mismatch between an output impedance of the amplification circuit as seen after the transformer and an input impedance of a radio frequency (RF) antenna as seen by the amplification circuit; wherein the RF antenna is coupled to an output port of the coupler;
   wherein the variable resonant circuit is arranged to receive a variable resonant circuit tuning signal and to set an impedance of the variable resonant circuit in response to the variable resonant circuit tuning signal; and
   a control circuit that is arranged to generate the variable resonant circuit tuning signal in response to the impedance indicative signal and for compensating for the impedance mismatch.

2. The system according to claim 1 wherein an impedance ratio between (a) an output impedance of the amplification circuit at an output port of the amplification circuit and (b) an input impedance of the RF antenna at an input port of the RF antenna exceeds two.

3. The system according to claim 1 wherein an impedance ratio between (a) an output impedance of the amplification circuit at an output port of the amplification circuit and (b) an input impedance of the RF antenna at an input port of the RF antenna is a fraction of fifty ohms.

4. The system according to claim 1, wherein the input impedance at an input port of the RF antenna substantially equals fifty Ohms; and wherein the output impedance of the amplification circuit at an output port of the amplification circuit equals 50/(N*N) Ohms and wherein the transformer has a turns ratio of 1:N, N being a positive number.

5. The system according to claim 1, wherein the input impedance of the RF antenna substantially equals fifty Ohms; and wherein an output impedance of the amplification circuit substantially equals to a fraction of fifty Ohms.

6. The system according to claim 1, wherein the resonant circuit further comprises a switch and wherein the amplification circuit further comprises a reception path amplifier that is arranged to receive a received signal that originated from the RF antenna and to amplify the received signal to provide a reception path amplified signal; wherein the control circuit is further arranged to generate amplification circuit tuning signals that comprise a reception path tuning signal and a transmission path tuning signal in response to the phase signal and the amplitude signal.

7. The system according to claim 6, wherein during at least one point of time the reception path tuning signal equals the transmission path tuning signal.

8. The system according to claim 6, wherein during at least one point of time the reception path tuning signal differs from the transmission path tuning signal.

9. The system according to claim 6, wherein the amplification circuit comprises a transmission path amplifier that is followed by the variable capacitor; wherein a capacitance of the variable capacitor is set by the transmission path tuning signal; and wherein the amplification circuit comprises a reception path amplifier that is preceded by a reception path variable capacitor; and wherein a capacitance of the reception path variable capacitor is set by the reception path tuning signal.

10. The system according to claim 1 wherein the detector is further arranged to output a power indicative signal that is indicative of an output power of the amplification circuit; wherein the control circuit is further arranged to generate an amplification circuit tuning signal in response to the impedance indicative signal and the power indicative signal; wherein a value of the amplification circuit tuning signal is set to maintain a substantially constant output power level of the amplification circuit regardless of changes in the impedance of the RF antenna.

11. A method for tuning a system, the method comprises:
    amplifying by an amplification circuit an input signal for providing an amplified signal;
    receiving by a variable resonant circuit the amplified signal and outputting a variable resonant circuit output signal; wherein the variable resonant circuit comprises a variable capacitor that is a continually tuned variable capacitor;
    receiving by a transformer the variable resonant circuit output signal and outputting a transformer output signal;
    sampling by a coupler the transformer output signal and a reflected signal and outputting a first signal that represents the transformer output signal and a second signal that represents the reflected signal;
    receiving by a detector the first and second signals and outputting an impedance indicative signal that is indicative of an impedance mismatch between an output impedance of the amplification circuit as seen after the transformer and an impedance of a radio frequency (RF) antenna as seen by the amplification circuit; wherein the RF antenna is coupled to an output port of the coupler;
    generating by a control circuit a variable resonant circuit tuning signal in response to the impedance indicative signal and for compensating for the impedance mismatch; and
    receiving by the variable resonant circuit the variable resonant circuit tuning signal and setting an impedance of the variable resonant circuit in response to the variable resonant circuit tuning signal.

12. The method according to claim 11 wherein an impedance ratio between (a) an output impedance of the amplification circuit at an output port of the amplification circuit and (b) an input impedance of the RF antenna at an input port of the RF antenna exceeds two.

13. The method according to claim 11 wherein an impedance ratio between (a) an output impedance of the amplification circuit at an output port of the amplification circuit and (b) an input impedance of the RF antenna at an input port of the RF antenna is smaller than one half.

14. The method according to claim 11, wherein the input impedance of the RF antenna at an input port of the RF antenna substantially equals fifty Ohms; and wherein the output impedance of the amplification circuit at an output port of the amplification circuit equals 50/(N*N) Ohms and wherein the transformer has a turns ratio of 1:N, N being a positive number.

15. The method according to claim 11, wherein the input impedance of the RF antenna substantially equals fifty Ohms; and wherein the output impedance of the amplification circuit substantially equals a fraction of fifty Ohms.

16. The method according to claim 11, comprising receiving by a reception path a received signal that originated from the RF antenna; amplifying the received signal to provide a reception path amplified signal; and generating by the control circuit amplification circuit tuning signals that comprise a reception path tuning signal and a transmission path tuning signal in response to the phase signal and the amplitude signal.

17. The method according to claim 16, wherein during at least one point of time the reception path tuning signal equals the transmission path tuning signal.

18. The method according to claim 16, wherein during at least one point of time the reception path tuning signal differs from the transmission path tuning signal.

19. The method according to claim 16, wherein the amplification circuit comprises a transmission path amplifier that is followed by the variable capacitor; wherein the method comprises setting a capacitance of the variable capacitor by the transmission path tuning signal; and wherein the reception path tunable amplification unit comprises a reception path amplifier that is preceded by a reception path variable capacitor; and the method comprises setting a capacitance of the reception path variable amplifier by the reception path tuning signal.

20. The method according to claim 11 comprising outputting by the detector a power indicative signal that is indicative of an output power of the amplification circuit; generating by the control circuit an amplification circuit tuning signal in response to the impedance indicative signal and the power indicative signal; wherein a value of the amplification circuit tuning signal is set to maintain a substantially constant output power level of the amplification circuit regardless of changes in the impedance of the RF antenna.

* * * * *